(12) United States Patent
Kozuki

(10) Patent No.: US 9,137,897 B2
(45) Date of Patent: Sep. 15, 2015

(54) ELECTRONIC DEVICE AND METHOD FOR MANUFACTURING ELECTRONIC DEVICE

(71) Applicant: Seiko Instruments Inc., Chiba (JP)

(72) Inventor: Atsushi Kozuki, Chiba (JP)

(73) Assignee: SEIKO INSTRUMENTS INC., Chiba (JP)

( * ) Notice: Subject to any disclaimer, the term of this patent is extended or adjusted under 35 U.S.C. 154(b) by 0 days.

(21) Appl. No.: 14/086,465

(22) Filed: Nov. 21, 2013

(65) Prior Publication Data
US 2014/0204541 A1 Jul. 24, 2014

(30) Foreign Application Priority Data

Jan. 23, 2013 (JP) ................... 2013-010531

(51) Int. Cl.
| | |
|---|---|
| H01L 41/00 | (2013.01) |
| H05K 1/18 | (2006.01) |
| H05K 1/03 | (2006.01) |
| H03H 9/10 | (2006.01) |
| H05K 3/40 | (2006.01) |
| H01L 41/29 | (2013.01) |
| H05K 3/24 | (2006.01) |
| H01L 23/15 | (2006.01) |
| H01L 23/498 | (2006.01) |

(52) U.S. Cl.
CPC .......... *H05K 1/0306* (2013.01); *H03H 9/1014* (2013.01); *H03H 9/1021* (2013.01); *H03H 9/1057* (2013.01); *H05K 3/4007* (2013.01); *H01L 23/15* (2013.01); *H01L 23/49827* (2013.01); *H01L 41/29* (2013.01); *H01L 2924/0002* (2013.01); *H05K 3/243* (2013.01); *H05K 2201/0367* (2013.01); *H05K 2201/10083* (2013.01); *H05K 2203/072* (2013.01); *H05K 2203/1147* (2013.01); *Y10T 29/4913* (2015.01)

(58) Field of Classification Search
CPC ................................ H01L 41/29; H01L 41/293
USPC ................... 361/748; 310/318, 319, 340, 363
See application file for complete search history.

(56) References Cited

U.S. PATENT DOCUMENTS

| | | | | |
|---|---|---|---|---|
| 6,204,454 B1 * | 3/2001 | Gotoh et al. | ................. | 174/255 |
| 6,487,088 B2 * | 11/2002 | Asai et al. | ..................... | 361/794 |
| 7,259,032 B2 * | 8/2007 | Murata et al. | ................... | 438/26 |
| 7,923,904 B2 * | 4/2011 | Takeuchi et al. | ............. | 310/340 |
| 8,207,654 B2 * | 6/2012 | Sugama et al. | ............... | 310/348 |
| 8,405,280 B2 * | 3/2013 | Ochi et al. | .................... | 310/328 |
| 8,531,092 B2 * | 9/2013 | Ichikawa et al. | ............. | 310/364 |
| 8,653,899 B2 * | 2/2014 | Aratake | ........................ | 331/156 |
| 8,664,837 B2 * | 3/2014 | Mizusawa | ..................... | 310/348 |
| 2008/0073110 A1 * | 3/2008 | Shioga et al. | ................. | 174/258 |

(Continued)

FOREIGN PATENT DOCUMENTS

JP 2011155506 A * 8/2011

*Primary Examiner* — Jeremy C Norris
*Assistant Examiner* — Nathan Milakovich
(74) *Attorney, Agent, or Firm* — Brinks Gilson & Lione

(57) ABSTRACT

An electronic device includes a glass substrate, an electronic element mounted on one surface of the glass substrate, a cover body covering the electronic element and bonded to the glass substrate and a through electrode penetrating from one surface to the other surface of the glass substrate. The through electrode is composed of an iron-nickel based alloy and; and a nickel film is formed on an end face of the through electrode exposing on the other surface of the glass substrate and on the other surface of the glass substrate located in the vicinity of the end face.

7 Claims, 4 Drawing Sheets

(56) References Cited

U.S. PATENT DOCUMENTS

| | | |
|---|---|---|
| 2010/0053918 A1* | 3/2010 | Nakamura et al. ............ 361/760 |
| 2010/0326721 A1* | 12/2010 | Nakamura et al. ............ 174/549 |
| 2012/0044025 A1* | 2/2012 | Nakamura et al. ............ 331/158 |
| 2012/0133052 A1* | 5/2012 | Kikuchi et al. ............... 257/774 |
| 2012/0153779 A1* | 6/2012 | Sato et al. .................... 310/344 |
| 2012/0225197 A1* | 9/2012 | Ebigase .......................... 427/77 |
| 2013/0077449 A1* | 3/2013 | Aratake .......................... 368/47 |
| 2013/0245755 A1* | 9/2013 | Fehr et al. .................... 623/6.22 |
| 2013/0250520 A1* | 9/2013 | Taniguchi ..................... 361/707 |
| 2014/0203688 A1* | 7/2014 | Kozuki ......................... 310/344 |
| 2015/0015118 A1* | 1/2015 | Kamijo ......................... 310/344 |
| 2015/0116969 A1* | 4/2015 | Kozuki et al. ................. 361/772 |
| 2015/0116971 A1* | 4/2015 | Kozuki et al. ................. 361/774 |

* cited by examiner

ELECTRONIC DEVICE AND METHOD FOR MANUFACTURING ELECTRONIC DEVICE

RELATED APPLICATIONS

This application claims priority under 35 U.S.C. §119 to Japanese Patent Application No. 2013-010531 filed on Jan. 23, 2013, the entire content of which is hereby incorporated by reference.

BACKGROUND OF THE INVENTION

1. Field of the Invention

The present invention relates to an electronic device in which an electronic element such as a quartz crystal vibrator is accommodated in a package, an oscillator using the same, and a method for manufacturing an electronic device.

2. Description of the Related Art

Surface mount type electronic devices have hitherto been frequently used in cellular phones and portable information terminals. Above all, in a quartz crystal vibrator, MEMS, a gyroscope, an acceleration sensor, and the like, a hollow cavity is formed in the inside of a package, and an electronic element such as a quartz crystal vibrator and MEMS is enclosed in this cavity. A glass material is used as the package. For example, an electronic element is mounted on a glass substrate, and a glass cover is bonded thereon by means of anodic bonding, whereby the electronic element is sealed hermetically. The anodic bonding between glasses brings about such advantages as high airtightness and inexpensiveness.

FIG. 6 is a cross-sectional view of an electronic device of this type (FIG. 1 of JP-A-2011-155506 (Patent Document 1)). An electronic device 101 includes a base 110, an electronic component 140 mounted on the base 110, and a cap 150 bonded to the base 110 while accommodating the electronic component 140 therein. In the base 110, a through electrode 121 penetrating in a plate thickness direction, a first metal film 122 electrically connected to the through electrode 121, and a circuit pattern 130 and a second metal film 123 each electrically connecting the through electrode 121 and the electronic component 140 to each other are formed. An external electrode 160 composed of a metal film is formed in the outside of the first metal film 122.

Here, an iron-nickel based alloy is used for the through electrode 121. Gold which is formed by an electroless plating method is used for the first metal film 122. In addition, a non-illustrated low-melting point glass is used between the through electrode 121 and the base 110, thereby enhancing the airtightness by means of heat welding. When it is intended to conduct heat welding using a low-melting point glass, thereby enhancing the airtightness between the through electrode 121 and the base 110, an oxide film is formed on an end face of the through electrode 121, so that the conductivity with other metal is lowered. Then, the oxidation of the through electrode 121 is prevented from occurring by removing the oxide film formed at the time of heat welding of the through electrode 121 and then forming the first metal film 122 or the second metal film 123 on the end face of the through electrode 121.

An iron-nickel based alloy is used as the through electrode 121, and a gold thin film is used as the first metal film 122 for preventing the oxidation of the through electrode 121 from occurring. A difference in ionization tendency between the iron-nickel based alloy and gold is so large that when moisture or the like is attached between the through electrode 121 and the first metal film 122, the through electrode 121 is corroded due to a battery effect, resulting in causing a lowering of conductivity. In addition, in Patent Document 1, a low-melting point glass is used between the through electrode 121 and the base 110, and a gold thin film of the first metal film 122 is formed on the end face of the through electrode 121 by an electroless plating method. Since it is difficult to form a gold thin film on the low-melting point glass by the electroless plating method, a boundary portion between the through electrode 121 and the first metal film 122 is exposed, so that the corrosion is much more advanced.

SUMMARY OF THE INVENTION

An electronic device according to the present invention includes a glass substrate, an electronic element mounted on one surface of the glass substrate, and a cover body covering the electronic element and bonded to the glass substrate, wherein on the glass substrate, a through electrode composed of an iron-nickel based alloy and penetrating from one surface to the other surface thereof is formed; and on an end face of the through electrode exposing on the other surface of the glass substrate and on the surface of the glass substrate located in the vicinity of the end face, a nickel film is formed.

In addition, the surface of the glass substrate and the end face are formed flush with each other.

In addition, the nickel film has a thickness of from 1 μm to 5 μm.

In addition, the nickel film is formed on the surface of the glass substrate in the range of from 1 μm to 5 μm from the end face.

In addition, a metal film having an ionization tendency smaller than the nickel film is formed on the surface of the nickel film.

In addition, the metal film is a gold thin film.

In addition, the electronic element is a quartz crystal vibrating piece.

An oscillator according to the present invention includes the electronic device as set forth in any one of the foregoing and a drive circuit supplying a drive signal to the electronic device.

A method for manufacturing an electronic device according to the present invention includes a through electrode forming step of forming a through electrode composed of an iron-nickel based alloy on a glass substrate; an electronic element mounting step of mounting an electronic element on one surface of the glass substrate; a cover body placing step of placing a cover body accommodating the electronic element therein on the glass substrate; and a nickel film forming step of forming a nickel film on an end face of the through electrode exposing on the other surface of the glass substrate by an electroless plating method.

In addition, after the through electrode forming step, there is further included a grinding step of grinding the surface on the other side of the glass substrate to make the surface of the glass substrate and the end face of the through electrode flush with each other.

In addition, in the nickel film forming step, the nickel film is formed in a thickness of from 1 μm to 5 μm.

In addition, there is further included a metal film forming step of forming a metal film having an ionization tendency smaller than the nickel film on the surface of the nickel film.

In addition, the electronic element is a quartz crystal vibrating piece.

The electronic device according to the present invention is an electronic device including a glass substrate, an electronic element mounted on one surface of the glass substrate, and a cover body covering the electronic element and bonded to the glass substrate, wherein on the glass substrate, a through electrode composed of an iron-nickel based alloy and penetrating from one surface to the other surface thereof is formed; and on an end face of the through electrode exposing on the other surface of the glass substrate and on the surface of the glass substrate located in the vicinity of the end face, a nickel film is formed. According to this configuration, it is possible to provide an electronic device capable of preventing the corrosion of the through electrode from occurring and having excellent durability.

DETAILED DESCRIPTION OF THE PREFERRED EMBODIMENTS

First Embodiment

Figure 1A:
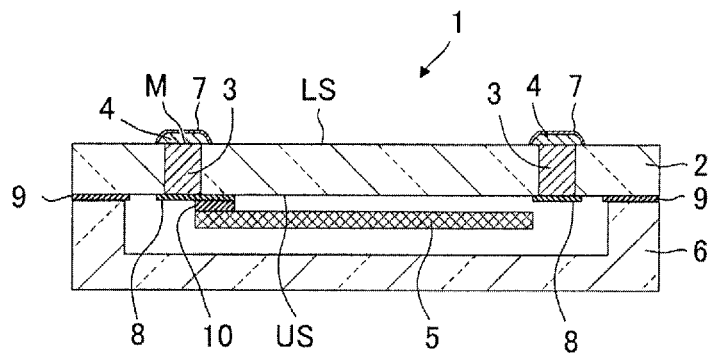
FIGS. 1(a) and 1(b) are each an explanatory view of an electronic device according to First Embodiment of the present invention.
Figure 1B:
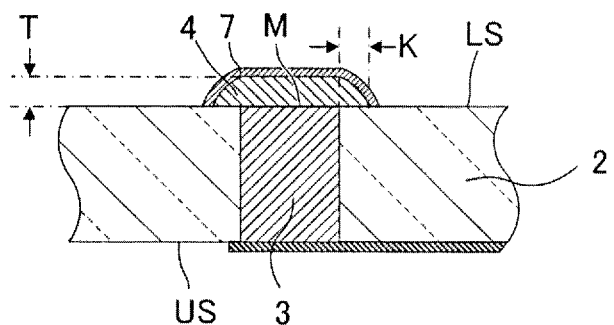

FIGS. 1(a) and 1(b) are each an explanatory view of an electronic device 1 according to First Embodiment of the present invention. FIG. 1(a) is a cross-sectional schematic view of the electronic device 1, and FIG. 1(b) is a partial cross-sectional schematic view of a glass substrate 2 used in the electronic device 1.

As shown in FIGS. 1(a) and 1(b), the electronic device 1 includes a glass substrate 2 on which a through electrode 3 is formed, an electronic element 5 mounted on one surface US of the glass substrate 2, and a cover body 6 covering the electronic element 5 and bonded to the glass substrate 2. Here, on the glass substrate 2, the through electrode 3 composed of an iron-nickel based alloy and penetrating from the one surface US to the other surface LS thereof is formed. A nickel film 4 is formed on an end face M of the through electrode 3 exposing on the other surface LS of the glass substrate 2 and on the surface of the glass substrate 2 located in the vicinity of the end face M. As the glass substrate 2, a glass material such as a soda-lime glass and a borosilicate glass can be used. When a glass material such as a soda-lime glass and a borosilicate glass is used as the cover body 6, the electronic device 1 with high reliability can be formed.

A detailed description is made by reference to FIG. 1(b). The through electrode 3 is embedded in the glass substrate 2. The other surface LS of the glass substrate 2 and the end face M of the through electrode 3 are formed flush with each other. A nickel film 4 is formed on the end face M by an electroless plating method. The nickel film 4 is formed so as to have a film thickness of from 1 μm to 5 μm. The nickel film 4 is located in the vicinity of the end face M of the through electrode 3 and also formed on the surface LS of the glass substrate 2. The nickel film 4 formed on the surface of the glass substrate 2 is formed in the range of a distance K of from 1 μm to 5 μm from the end face M of the through electrode 3 at the same degree as the film thickness T of the nickel film 4. When the film thickness T of the nickel film 4 becomes thicker, the distance K from the end face M also becomes larger.

It is to be pointed out that the through electrode 3 is composed of an iron-nickel based alloy and is small in a difference in ionization tendency from the nickel film 4 formed on the end face M thereof, and hence, the corrosion due to a battery effect hardly takes place. In addition, a metal film 7 having an ionization tendency smaller than the nickel film 4, for example, a gold thin film, can be formed on the surface of the nickel film 4. An oxide film is formed on the surface of the nickel film 4 by the metal film 7, whereby a lowering of conductivity can be prevented from occurring. In addition, since the nickel film 4 intervenes between the metal film 7 and the through electrode 3, moisture or the like is blocked so that a battery effect is not generated, and the corrosion of the through electrode 3 is prevented from occurring. It is to be pointed out that in the present invention, the metal film 7 formed on the surface of the nickel film is not an essential requirement, but only the nickel film 4 may be enough.

When the film thickness T of the nickel film 4 is thinner than 1 μm, a cap effect for isolating the end face M of the through electrode 3 from moisture or the like is easily lowered, whereas, when the film thickness T is thicker than 5 μm, an internal stress of the nickel film 4 becomes large, so that chipping or breakage of glass is easily generated on the glass substrate 2 in a lower portion of the film. More preferably, the film thickness T of the nickel film 4 is from 1 μm to 3 μm. According to this, the generation of chipping or breakage of glass in a lower portion of the nickel film 4 can be surely prevented from occurring.

A wiring electrode 8 electrically connected to the through electrode 3, a metal bump 10 formed in an upper portion of the wiring electrode 8, and the electronic element 5 surface-mounted via the metal bump 10 are placed on the one surface US of the glass substrate 2. The cover body 6 is bonded to the outer periphery of the glass substrate 2 via a bonding material 9. A space between the cover body 6 and the glass substrate 2 is sealed airtightly, and the inside thereof is evacuated in vacuo. As the electronic element 5, piezoelectric vibrating pieces, for example, quartz crystal vibrating pieces, light emitting elements, light receiving elements, acceleration sensors, MEMS (micro electro mechanical systems), and other elements can be used. Anodic bonding or intermetallic bonding can be conducted using a metal film as the bonding material 9. In addition, the cover body 6 and the glass substrate 2 can be bonded to each other by using an adhesive as the bonding material 9. It is to be pointed out that in addition to the surface mounting of the wiring electrode 8 and the electronic element 5 via the metal bump 10, the wiring electrode 8 and the electronic element 5 may also be electrically connected to each other by means of wire bonding.

Second Embodiment

Figure 2:
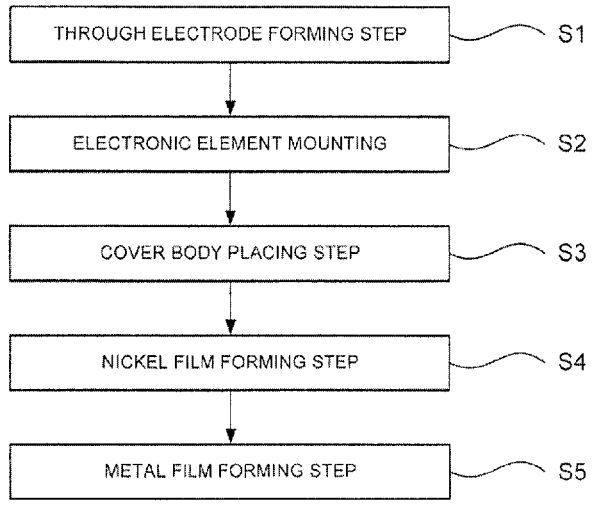
FIG. 2 is a flow chart expressing a method for manufacturing an electronic device according to Second Embodiment of the present invention.
Figure 3:
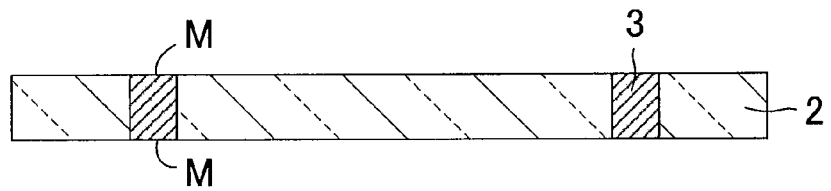
FIGS. 3(S1) to 3(S5) are each an explanatory view of a manufacturing process of an electronic device according to Second Embodiment of the present invention.
Figure 3:
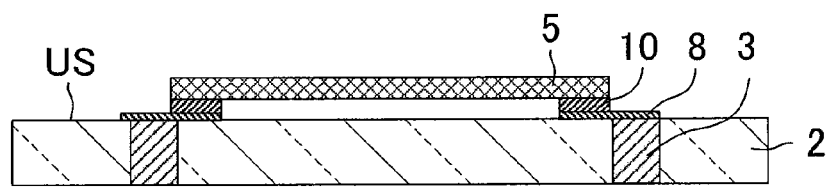
Figure 3:
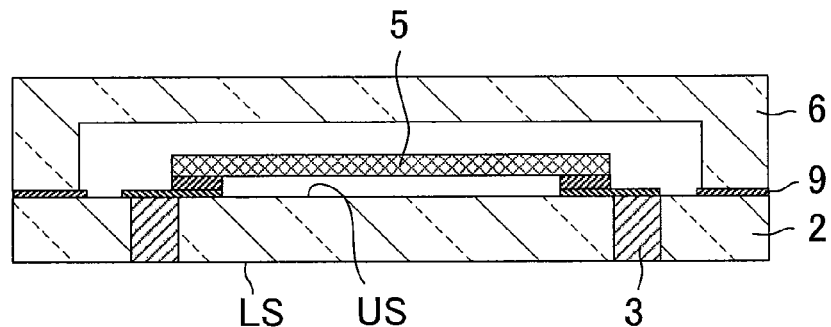
Figure 3:
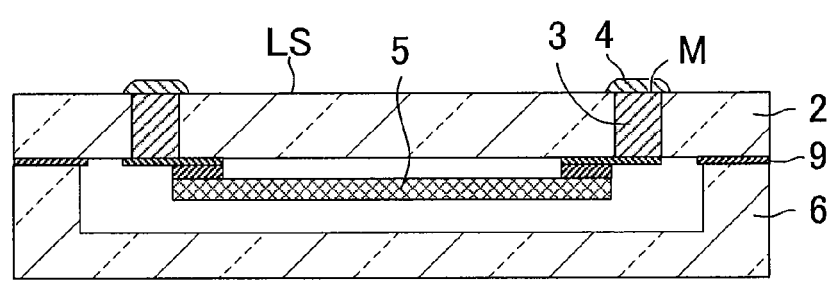
Figure 3:
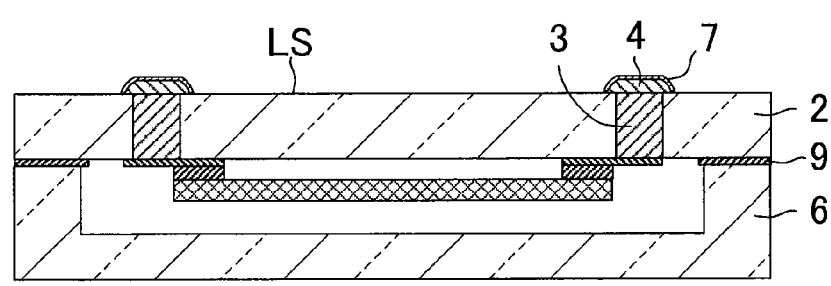

FIG. 2 is a flow chart expressing a method for manufacturing an electronic device according to Second Embodiment of the present invention. FIGS. 3(S1) to 3(S5) are each an explanatory view of a manufacturing process of an electronic device according to the Second Embodiment of the present invention. As shown in FIG. 2, first of all, in a through electrode forming step S1, a through electrode composed of an iron-nickel based alloy is formed on a glass substrate. Subsequently, in an electronic element mounting step S2, an electronic element is mounted on one surface of the glass substrate. Subsequently, in a cover body placing step S3, a cover body is placed on the glass substrate while accommodating the electronic element therein. Subsequently, in a nickel film forming step S4, a nickel film is formed on an end face of the through electrode exposing on the other surface of the glass substrate by an electroless plating method. Subsequently, in a metal film forming step S5, a metal film is formed on the surface of the nickel film.

As the glass substrate, a soda-lime glass, a borosilicate glass, or other glass can be used. As the through electrode, an iron-nickel based alloy such as Kovar, invar, permalloy, 42 Alloy, and stainless steel can be used. By forming the nickel film on the end face of the through electrode by an electroless plating method, the nickel film is formed in such a manner that a cap is covered on the end face of the through electrode and on the surface of the glass substrate located in the vicinity of the end face, and the end face of the through electrode is sealed hermetically. Accordingly, even when moisture or the like is attached onto the periphery, it does not come into contact with the through electrode, so that the corrosion of the through electrode to be caused due to a battery effect is prevented from occurring. In order to prevent the oxidation of the nickel film from occurring, a metal material having a small ionization tendency, such as gold, can be formed on an upper surface of the nickel film.

It is to be pointed out that the method for manufacturing an electronic device may also be conducted in such a manner that after the through electrode forming step S1 and before the electronic element mounting step S2, the nickel film forming step S4 is conducted to form the nickel film on the end face of the through electrode 3; subsequently, in the metal film forming step S5, the metal film is formed on the surface of the nickel film; and subsequently, the electronic element mounting step S2 and the cover body placing step S3 are conducted. In addition, after the cover body placing step S3 and before the nickel film forming step S4, a grinding step of grinding or polishing the other surface of the glass substrate to make the end face of the through electrode and the other surface of the glass substrate flush with each other and also removing the oxide film formed on the end face can be added. According to this, a lowering of conductivity between the nickel film and the through electrode can be prevented from occurring.

The method for manufacturing the electronic device 1 according to the present invention is more specifically described by reference to FIGS. 3(S1) to 3(S5). FIG. 3(S1) is a cross-sectional schematic view expressing a state in which in the through electrode forming step S1, the through electrode 3 is formed on the glass substrate 2. As the glass substrate 2, for example, a soda-lime glass can be used. A glass material is softened or fused and subjected to die forming to form a through hole. A wire material of an iron-nickel based alloy is filled in the through hole and heated and softened to weld the wire material and the glass substrate to each other. After cooling the glass substrate, both the surfaces thereof are flattened by means of polishing, and not only the oxide film on the end face M of the through electrode 3 is removed, but the end face M and the surface of the glass substrate 2 are formed flush with each other. The flattened glass substrate 2 has a thickness of, for example, from 0.2 mm or 1 mm. It is to be pointed out that the through hole of the glass substrate 2 can also be formed by a sand blast method or an etching method.

FIG. 3(S2) is a cross-sectional schematic view expressing a state in which in the electronic element mounting step S2, the electronic element 5 is surface-mounted on the glass substrate 2. The metal film is formed on the one surface US of the glass substrate 2 by a vapor deposition method, a sputtering method, or the like, and patterning of the metal film is conducted by photolithography and an etching method to form the wiring electrode 8. The wiring electrode 8 may also be formed by a printing method in place of the vapor deposition method or sputtering method. Subsequently, the electronic element 5 is placed on the glass substrate 2 via the metal bump 10 by means of surface mounting. In place of the surface mounting, the electronic element 5 may also be adhered onto the surface of the glass substrate 2 by using an adhesive or the like, followed by electrically connecting the wiring electrode 8 and the electronic element 5 via a gold wire by means of wire bonding.

FIG. 3(S3) is a cross-sectional schematic view expressing a state in which in the cover body placing step S3, the electronic element 5 is bonded to the glass substrate 2. As the cover body 6, for example, the same soda-lime glass as that in the glass substrate 2 can be used. The cover body 6 includes a recess in the center thereof, and the bonding material 9 is previously formed on an upper end face of the recess. As the bonding material 9, for example, a conductive film such as an aluminum film, a chromium film, and a silicon film, or a composite layer thereof is formed by a vapor deposition method, a sputtering method, or the like. Then, the electronic element 5 is accommodated in the recess of the center, and the glass substrate 2 and the cover body 6 are bonded to each other by means of anodic bonding. On the occasion of bonding, the inside of a package in which the electronic element 5 is accommodated can be evacuated in vacuo. For example, in the case of using a quartz crystal vibrating piece as the electronic element 5, when the inside of the package is kept in vacuo, the air resistance against physical vibration of the quartz crystal vibrating piece can be eliminated. It is to be pointed out that a space between the glass substrate 2 and the cover body 6 can also be bonded to each other by means of, in addition to the anodic bonding, intermetallic bonding or bonding with an adhesive depending upon an application.

FIG. 3(S4) is a cross-sectional schematic view expressing a state in which in the nickel film forming step S4, the nickel film 4 is formed on the end face M of the through electrode 3 exposing on the other surface LS of the glass substrate 2. As described in the First Embodiment, the nickel film 4 is formed in a thickness of from 1 μm to 5 μm on the end face M exposing on the other surface LS by an electroless plating method. According to this, the nickel film 4 is formed on the surface of the glass substrate 2 in the range of a distance of from 1 μm to 5 μm from the end face M. Namely, the end face M of the through electrode 3 is covered such that it is capped by the nickel film 4. When the nickel film 4 is thinner than 1 μm, moisture or the like invading from the outside is easy to come into contact with the through electrode 3, whereas, when the nickel film 4 is thicker than 5 μm, an internal stress of the nickel film 4 works on the glass substrate 2 located in the vicinity of the end face M, so that chipping or cracking of the glass is easily generated. In all of these cases, the reliability is lowered.

FIG. 3(S5) is a cross-sectional schematic view expressing a state in which in the metal film forming step S5, the metal film 7 is formed on the surface of the nickel film 4. The metal film 7 having an ionization tendency smaller than the nickel film 4 is formed on the surface of the nickel film 4, and an oxide film is formed on the surface of the nickel film 4, whereby a lowering of conductivity is prevented from occurring. As the metal film 7, for example, a gold thin film can be formed. The gold thin film can be simply formed by an electroless plating method. In addition, a metal material such as copper, silver, and platinum can be used as the metal film 7.

After the metal film forming step S5, an external electrode can be formed so as to cover the nickel film 4 and the metal film 7. The external electrode can be formed by printing a conductive material such as a silver paste, followed by baking.

In this way, by forming the nickel film 4 on the end face M of the through electrode 3 composed of an iron-nickel based alloy, the corrosion of the through electrode 3 can be prevented from occurring. It is to be pointed out that in the present invention, the metal film forming step S5 is not an essential requirement, but even when this metal film forming step S5 is omitted, there can be brought an effect for preventing the corrosion of the through electrode 3 from occurring.

Third Embodiment

Figure 4:
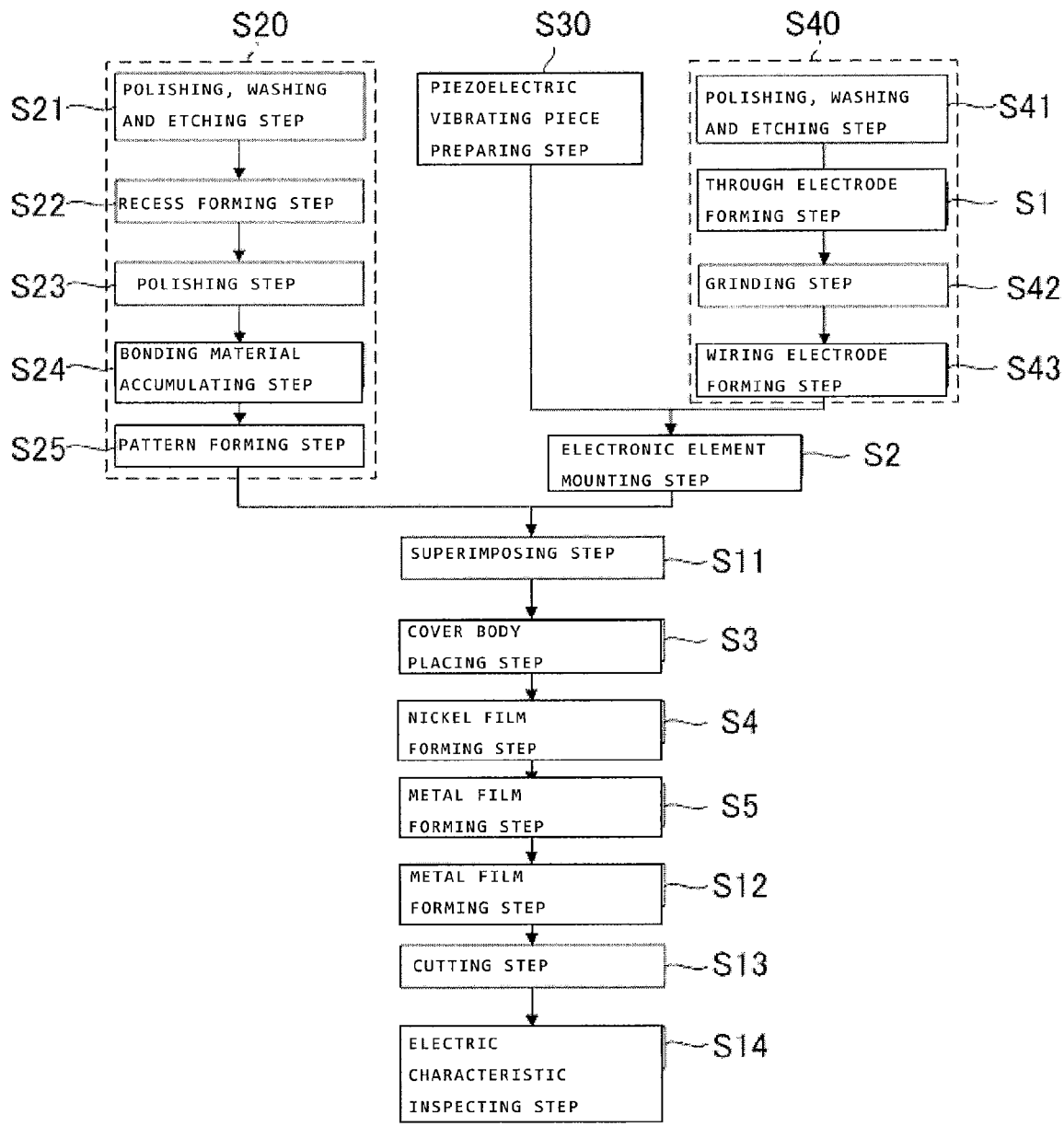
FIG. 4 is a flow chart expressing a method for manufacturing an electronic device according to Third Embodiment of the present invention.

FIG. 4 is a flow chart expressing a method for manufacturing an electronic device according to Third Embodiment of the present invention. The Third Embodiment is concerned with a specific example of manufacturing an electronic device composed of a piezoelectric vibrator in which a piezoelectric vibrating piece is mounted as an electronic element. It is to be pointed out that the present embodiment is concerned with a manufacturing method in which a glass wafer having a lot of recesses formed therein and a glass wafer having a lot of electronic elements mounted thereon are superimposed on and bonded to each other, thereby simultaneously forming a lot of electronic devices 1. The same symbols are given in the same steps, respectively.

The electronic element which is mounted on the glass substrate is a piezoelectric vibrating piece composed of a quartz crystal vibrator or the like. A cover body forming step S20 is described. A plate-shaped glass wafer composed of a soda-lime glass is prepared. First of all, in a polishing, washing and etching step S21, the glass wafer is polished to a prescribed thickness and washed, and thereafter, an etching treatment is conducted to remove a work-affected layer of the outermost surface. Subsequently, in a recess forming step S22, a recess is formed in a central portion of a region where each electronic device is formed by means of die forming with a heat press. Subsequently, in a polishing step S23, an upper end face of the periphery of the recess is subjected to polishing processing into a flat mirror-finished surface. Subsequently, in a bonding material accumulating step S24, a bonding material composed of, for example, aluminum is accumulated in a thickness of from 50 nm to 150 nm on the surface of the cover body having a recess formed therein by a sputtering method or a vapor deposition method. Subsequently, in a pattern forming step S25, the bonding material is removed from the surface other than the upper end face of the periphery of the recess by photolithography and an etching method. In this way, a cover body composed of a glass wafer is formed.

A piezoelectric vibrating piece preparing step S30 is described. A rough stone of quartz crystal is sliced at a prescribed angle, a quartz crystal wafer is formed, and subsequently, the quartz crystal wafer is subjected to grinding and polishing processing to a fixed thickness. Subsequently, a work-affected layer of the quartz crystal wafer is removed by conducting an etching treatment. Subsequently, a metal film is accumulated on both the surfaces of the quartz crystal wafer, and the metal film is subjected to patterning by photolithography and an etching method and processed into an excitation electrode, a wiring electrode, and a mount electrode, respectively, each having a prescribed shape. Subsequently, the quartz crystal wafer is processed into an outer shape of a piezoelectric vibrating piece by photolithography and an etching method or dicing.

A glass substrate forming step S40 is described. A plate-shaped glass wafer composed of a soda-lime glass is prepared. First of all, in a polishing, washing and etching step S41, the glass wafer is polished to a prescribed thickness and washed, and thereafter, an etching treatment is conducted to remove a work-affected layer of the outermost surface. Subsequently, in a through electrode forming step S1, a through hole is formed in a plate thickness direction of the glass wafer by means of die forming with a heat press, or placing a mask on the surface and then conducting an etching treatment or grinding by sand blast. Subsequently, a through electrode composed of an iron-nickel based alloy is embedded in this through hole. Subsequently, in a grinding step S42, both the end portions of the through electrode and both the surfaces of the glass wafer are ground and flattened, thereby exposing an end face of the through electrode. Subsequently, in a wiring electrode forming step S43, a metal film is accumulated on one surface of the glass substrate by a sputtering method or a vapor deposition method and subjected to patterning into a wiring electrode by photolithography and an etching method.

Subsequently, in an electronic element mounting step S2, the piezoelectric vibrating piece is amounted on the surface of the glass substrate. On the occasion of mounting, a conductive adhesive or a metal bump is placed on the wiring electrode of the glass substrate, and the mount electrode of the piezoelectric vibrating piece is bonded thereonto, thereby immobilizing the piezoelectric vibrating piece in a cantilever form onto the glass substrate. According to this, the through electrode and the excitation electrode of the piezoelectric vibrating piece are electrically connected to each other. In this way, a glass substrate composed of a glass wafer having a lot of piezoelectric vibrating pieces mounted thereon is formed.

Subsequently, in a superimposing step S11, a cover body is placed on the glass substrate such that each piezoelectric vibrating piece is accommodated in each recess of the cover body, followed by pressing from a vertical direction. Subsequently, in a cover body placing step S3, the glass substrate and the cover body are heated at a temperature of 200° C. or higher, and a voltage of several hundred volts is impressed while making a bonding material of the cover body as an anode and making the glass substrate as a cathode, respectively, thereby boding the glass substrate and the cover body to each other via the bonding material. On the occasion of bonding, the periphery is kept in vacuo.

Subsequently, in a nickel film forming step S4, a nickel film is accumulated on an end face of the through electrode exposing on the other surface of the glass substrate. The nickel film is accumulated in a film thickness in the range of from 1 μm to 5 μm by means of electroless plating. According to this, the nickel film is accumulated on the surface of the glass substrate in a distance of from 1 μm to 5 μm from the end face. The nickel film covers the end face of the through electrode in such a manner that a cap is covered thereon. According to this, moisture or the like does not come into contact with the through electrode, so that the corrosion of the through electrode is prevented from occurring.

Subsequently, in a metal film forming step S5, a metal film composed of, for example, gold is formed on the surface of the nickel film by an electroless plating method, thereby preventing the oxidation of the surface of the nickel film from occurring, so that the conductivity is ensured. Subsequently, in an external electrode forming step S12, a conductive material composed of a silver paste or the like is printed so as to cover a stacked electrode of the nickel film and the gold thin film, followed by baking to form an external electrode. Subsequently, in a cutting step S13, a scribe line is provided on the surface of the bonded body, and a cutting blade is pressed for cutting thereon. Alternatively, the bonded body is divided using a dicing blade or a dicing saw, thereby obtaining the individual electronic devices 1. Subsequently, in an electric characteristic inspecting step S14, a resonant frequency, a resonant resistance value, or the like of the electronic device 1 is measured and inspected.

Fourth Embodiment

Figure 5:
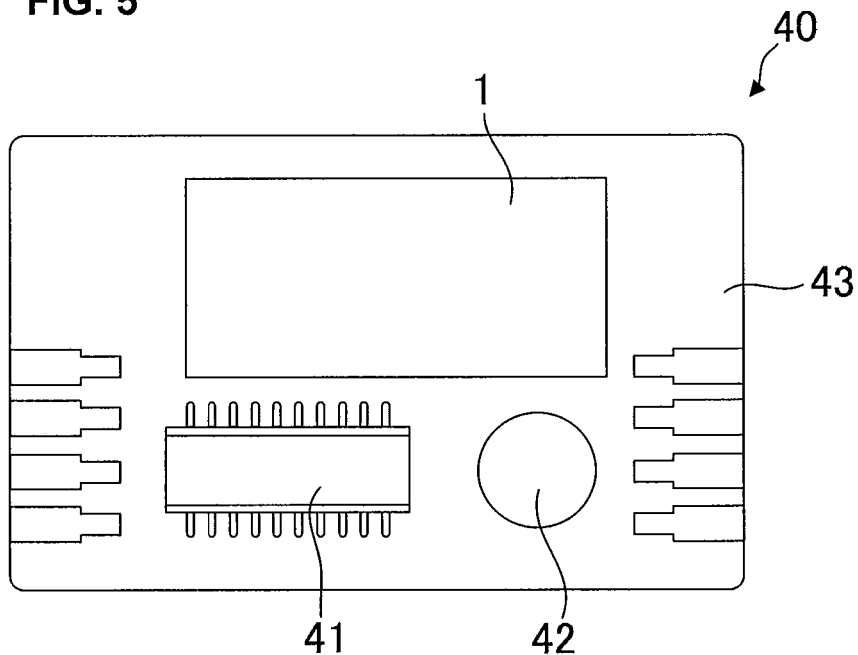
FIG. 5 is an upper schematic view of an oscillator according to Fourth Embodiment of the present invention.
Figure 6:
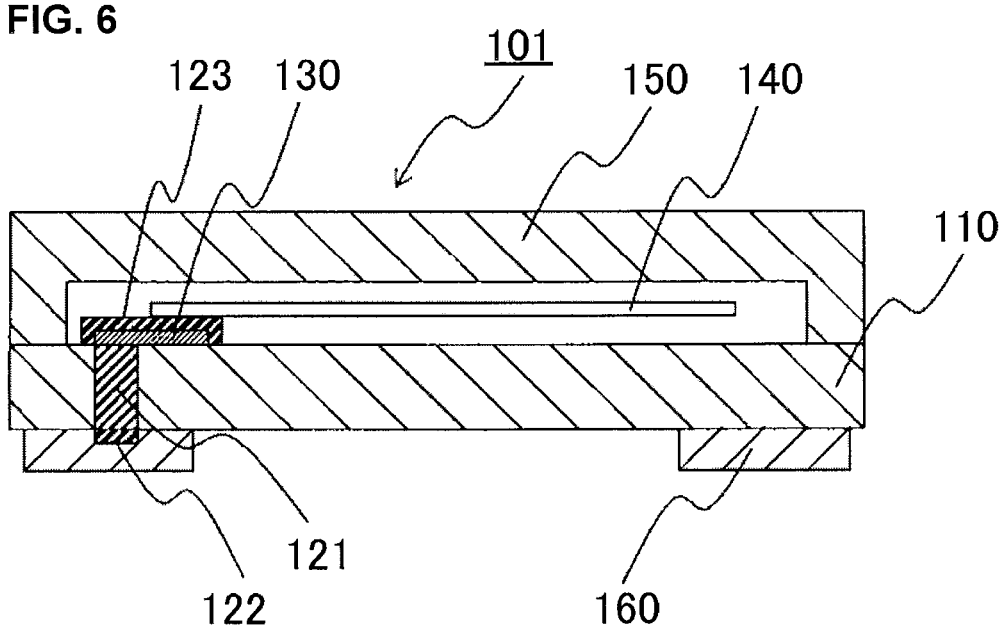
FIG. 6 is a cross-sectional view of a conventionally known electronic device.

FIG. 5 is an upper schematic view of an oscillator 40 according to Fourth Embodiment of the present invention. The electronic device 1 described above in the First Embodiment or the electronic device 1 manufactured by the manufacturing method described above in the Second or Third Embodiment is installed in the oscillator 40. As shown in FIG. 5, the oscillator 40 includes a substrate 43, the electronic device 1 placed on this substrate, an integrated circuit 41, and an electronic component 42. The electronic device 1 produces a signal of a fixed frequency on the basis of a drive signal given to an external electrode, and the integrated circuit 41 and the electronic component 42 process the signal of a fixed frequency supplied from the electronic device 1, thereby producing a reference signal such as a clock signal. Since the electronic device 1 according to the present invention can be formed so as to have high reliability and have a small size, it is possible to configure the whole of the oscillator 40 with a compact size.

What is claimed is:

1. An electronic device comprising:
   a glass substrate;
   an electronic element mounted on a first surface of the glass substrate;
   a cover body covering the electronic element and bonded to the glass substrate; and
   a through electrode penetrating from the first surface to a second surface of the glass substrate opposite the first surface,
   wherein the through electrode comprises an iron-nickel based alloy; and
   a nickel film contacts an end face of the through electrode exposed on the second surface of the glass substrate and contacts the second surface of the glass substrate in proximity to the end face,
   wherein the nickel film has a thickness of 1 μm to 3 μm and the nickel film on the second surface of the glass substrate extends along the second surface for a distance of 1 μm to 5 μm from the end face.

2. The electronic device according to claim 1, wherein the second surface of the glass substrate and the end face are flush with each other.

3. The electronic device according to claim 1, wherein a metal film resides on the surface of the nickel film and has an ionization tendency less than the nickel film.

4. The electronic device according to claim 3, wherein the metal film comprises a gold thin film.

5. A method for manufacturing an electronic device, the method comprising:
   forming a through electrode comprising an iron-nickel based alloy in a glass substrate;
   mounting an electronic element on a first surface of the glass substrate;
   placing a cover body accommodating the electronic element therein on the glass substrate; and
   after placing the cover body, forming a nickel film in contact with an end face of the through electrode exposed on a second surface of the glass substrate by an electroless plating method,
   wherein the nickel film is formed in a thickness of 1 μm to 3 μm and the nickel film on the second surface of the glass substrate extends along the second surface for a distance of 1 μm to 5 μm from the end face.

6. The method for manufacturing an electronic device according to claim 5 further comprising, after forming the through electrode, grinding the second surface of the glass substrate to make the second surface of the glass substrate and the end face of the through electrode flush with each other.

7. The method for manufacturing an electronic device according to claim 5 further comprising, after the nickel film forming step, forming a metal film having an ionization tendency less than the nickel film on a surface of the nickel film.

* * * * *